(12) United States Patent
Okayama et al.

(10) Patent No.: US 7,492,045 B2
(45) Date of Patent: Feb. 17, 2009

(54) SEMICONDUCTOR MODULE, METHOD FOR MANUFACTURING SEMICONDUCTOR MODULES AND MOBILE DEVICE

(75) Inventors: Yoshio Okayama, Gifu (JP); Ryosuke Usui, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/928,368

(22) Filed: Oct. 30, 2007

(65) Prior Publication Data
US 2008/0128903 A1 Jun. 5, 2008

(30) Foreign Application Priority Data
Oct. 31, 2006 (JP) .............................. 2006-295172
Oct. 17, 2007 (JP) .............................. 2007-270555

(51) Int. Cl.
*H01L 23/48* (2006.01)
(52) U.S. Cl. ...................................... 257/737
(58) Field of Classification Search ......... 257/734–737, 257/E21.506
See application file for complete search history.

(56) References Cited

U.S. PATENT DOCUMENTS 6,798,062 B2 * 9/2004 Mamitsu et al. ............. 257/713
6,806,118 B2 * 10/2004 Okamoto et al. ............ 438/108
6,809,405 B2 * 10/2004 Ito et al. ..................... 257/666
6,809,421 B1 * 10/2004 Hayasaka et al. ........... 257/777

FOREIGN PATENT DOCUMENTS

| JP | 09-289264 | 11/1997 |
|----|-----------|---------|
| JP | 11-298143 | 10/1999 |
| JP | 2001-144206 | 5/2001 |

* cited by examiner

*Primary Examiner*—Nathan W Ha
(74) *Attorney, Agent, or Firm*—Fish & Richardson P.C.

(57) ABSTRACT

Connection reliability in electrode portions of a semiconductor module is improved. A semiconductor wafer is prepared where a plurality of semiconductor substrates each having an electrode and a protective film at the surface is formed in a matrix shape. Next, at the surface of the semiconductor wafer (semiconductor substrate) a insulation layer is held between the semiconductor substrate and a copper sheet (metal sheet) formed integrally with a bump containing a plastic region on a tip part. With the insulating held between them, the semiconductor substrate, the insulating layer and the copper sheet are press-formed by a press machine into a single block. The bump penetrates the insulating layer, and the plastic region on the tip part is plastic deformed at a contact surface with an electrode, so that the bump and the electrode are electrically connected together.

13 Claims, 13 Drawing Sheets

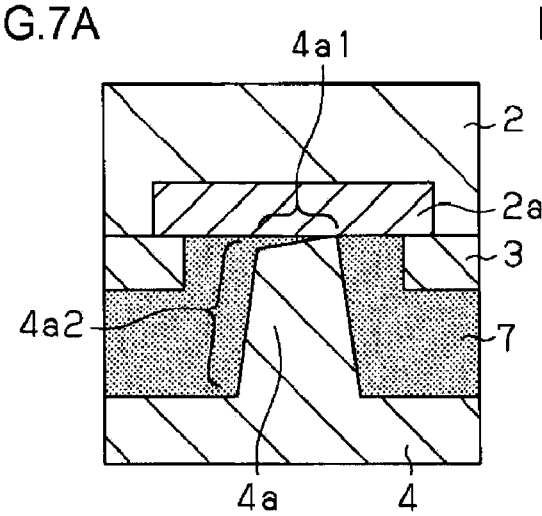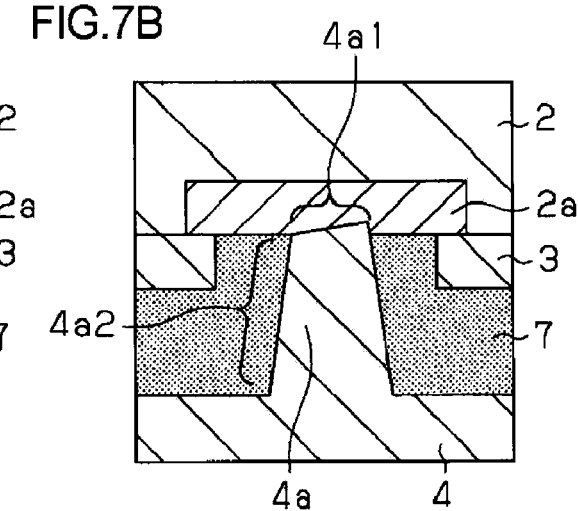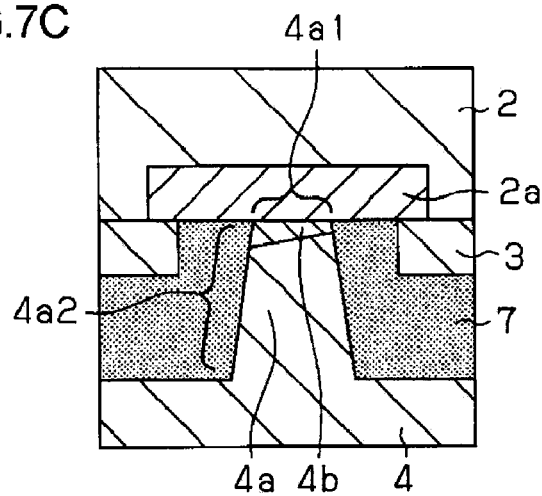

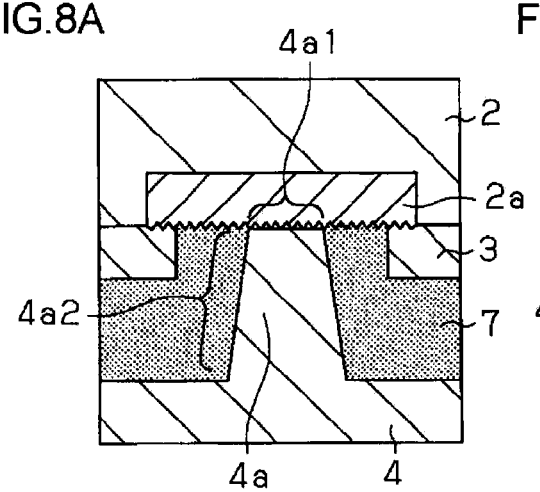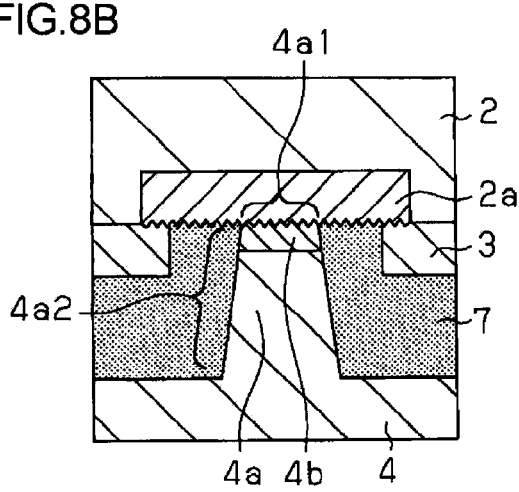

SEMICONDUCTOR MODULE, METHOD FOR MANUFACTURING SEMICONDUCTOR MODULES AND MOBILE DEVICE

CROSS-REFERENCE TO RELATED APPLICATIONS

This application is based upon and claims the benefit of priority from the prior Japanese Patent Applications No. 2006-295172, filed Oct. 31, 2006, and Japanese Patent Application No. 2007-270555, filed Oct. 17, 2007, the entire contents of which are incorporated herein by reference.

BACKGROUND OF THE INVENTION

1. Field of the Invention

The present invention relates to a semiconductor module, a method for manufacturing the semiconductor modules, and a mobile device.

2. Description of the Related Art

There is a type of semiconductor module called a CSP (Chip Size Package) among the conventional semiconductor modules. A semiconductor module of CSP type is produced by a process in which a semiconductor wafer (semiconductor substrate) with LSIs (semiconductor devices) and external connection electrodes connected thereto formed on a main face thereof is diced into individual modules. Therefore, a semiconductor module can be fixed onto a wiring substrate in a size practically the same as an LSI chip. This helps realize the miniaturization of a wiring substrate on which the semiconductor module is mounted.

In recent years, following the trend of electronic devices towards miniaturization and higher performance, demand has been ever greater for further miniaturization of semiconductor modules which are used in them. To realize such miniaturization of semiconductor modules, it is of absolute necessity that the pitch of electrodes that allow packaging on wiring substrate be made narrower. A known method of surface-mounting a semiconductor device is flip chip mounting in which solder bumps are formed on external connection electrodes of the semiconductor device and the solder bumps are soldered to an electrode pad of a wiring substrate. With this flip-chip mounting method, however, there are restrictive factors for the narrowing of the pitch of external connection electrodes, such as the size of the solder bump itself and the bridge formation at soldering. A way used to overcome these limitations in recent years has been a rearrangement of external connection electrodes by forming a rewiring in the semiconductor device. For example, in a known method for such rearrangement, a bump structure formed by half-etching a metal sheet is used as an electrode or a via, and external connection electrodes of the semiconductor device are connected to the bump structure by mounting the semiconductor device on the metal sheet through an insulating layer of an epoxy resin or the like.

On the other hand, in order to improve connection reliability, between the electrode made of metal and the bump structure, in manufacturing flexible substrates and printed boards, a method has been proposed where an adhesion layer such as flexible metallic coating (e.g., gold film) or conductive adhesive (e.g., soldering paste) is provided at a tip or peripheral part of the bump structure and a connection is made between the electrode and the bump structure through this adhesion layer.

However, differing from the connections found in the flexible substrates and printed boards, thermal expansion coefficients differs vastly between silicon constituting a semiconductor device and the metal sheet such as copper in the case of a semiconductor module. For this reason, heat stress due to a difference in thermal expansion coefficients between materials occurs at a connection portion, where the external connection electrode and the bump are connected together, as a result of a temperature change caused by a heat treatment or the like. In particular, when in the future the miniaturization of external connection electrodes and connection pitch of the bump structure advances to realize further reduction in size of the semiconductor modules, a contact area between the external connection electrode and the bump structure becomes smaller. As a result, there is concern that such heat stress may cause disconnection in the connection between the external electrode and the bump structure.

SUMMARY OF THE INVENTION

The present invention has been made in view of the foregoing problems, and a general purpose thereof is to provide a technology for improving the connection reliability in electrode portions of a semiconductor module.

In order to resolve the above problems, a semiconductor module according to one embodiment of the present invention comprises: an insulating layer; a first electrode provided on a surface of the insulating layer; a second electrode provided on the other surface of the insulating layer; and a bump electrically connected with the second electrode by penetrating the insulating layer, the bump being provided integrally with the first electrode, wherein the bump has a plastic region on a tip part thereof and the plastic region is plastic deformed and connected with the second electrode.

According to this embodiment, the plastic region is contained in the tip part of the bump, and the first electrode and the second electrode are connected together through the medium of the bump which is formed integrally with the first electrode. Thereby, the disconnection at an interface between the first electrode (bump) and the second electrode or the like that may occur due to a temperature change is suppressed, so that the connection reliability between the first electrode and the second electrode improves. The reason for this is as follows. That is, since the bump containing the plastic region therein is formed integrally with the first electrode, the interface (contact surface) no longer exists between the bump and the plastic region. And this suppresses the stress loading caused by thermal expansion that occurs when an conventional adhesion layer such as solder paste is used. Also, the plastic deformed bump (plastic region in the tip part) contributes to an increase in contact area of the interface with the second electrode and therefore the adhesion between the bump and the second electrode improves.

In the above structure, the bump and the second electrode may be made of the same metal. According to this embodiment, the thermal expansion coefficients of the bump and the second electrode become identical to each other. Thus the connection reliability for the heat stress of the semiconductor module can be further improved.

In the above structure, the first electrode and the bump may be formed using a rolled metal. By employing this structure, the production cost of the semiconductor modules can be further reduced.

In the above structure, the plastic region may include fine asperities formed on the tip part of the bump. By employing this structure, the connection reliability of the semiconductor module can be improved and the manufacturing cost thereof can be further reduced.

In the above structure, the plastic region may be made of metal which is more plastic-deformable than portions except for the plastic region of the bump. With this structure, the adhesion between the bump and the second electrode can be further enhanced. Accordingly, the connection reliability of the semiconductor module can be further improved.

In the above structure, the plastic region may be made of gold. With this structure, the adhesion between the bump and the second electrode can be further enhanced. As a result, the connection reliability of the semiconductor module can be further improved.

In the above structure, the tip part of the bump may be of a reversed mesa structure realized by a plastic deformation of the plastic region. By employing this structure, the migration of the bump with respect to a penetrating direction is suppressed by an anchor effect of the bump containing the plastic region. As a result, adhesion between the bump and the second electrode is improved. Hence the connection reliability for the heat stress of the semiconductor module can be further improved.

Another embodiment of the present invention relates to a mobile apparatus. This mobile apparatus mounts a semiconductor module according to any of the above-described embodiments.

According to this embodiment, the connection reliability between the bump and the second electrode is improved and thereby the connection reliability of the semiconductor module is improved. As a result, the reliability of the mobile apparatus with such a semiconductor module mounted thereon is improved. Also, the manufacturing cost of the semiconductor modules is reduced, so that the manufacturing cost of the mobile apparatus that mounts such a semiconductor module thereon can be suppressed.

In order to resolve the above problems, a method, for manufacturing a semiconductor module, according to one embodiment of the present invention comprises: a first process of preparing a semiconductor substrate having an electrode on a surface thereof; a second process of forming a metal sheet with which a bump having a plastic region on a tip thereof is provided integrally; and a third process of press-bonding the metal sheet and the semiconductor substrate by way of an insulating layer and electrically connecting the bump with the electrode in a manner such that the bump penetrates the insulating layer and the plastic region is plastic deformed.

According to this embodiment, a semiconductor module is manufactured by press-bonding the metal sheet with which the bump having the plastic region in the tip part is integrally formed. As a result, a semiconductor module with improved connection reliability for the heat stress can be easily manufactured as compared with a case where the conventional adhesion layer such as solder paste is employed.

Also, when the metal sheet is press-bonded, the plastic region of the bump is plastic deformed at a contact surface with an electrode of the semiconductor substrate. As a result, a variation in the degree of parallelization of a tip surface of the bump in a manufacturing process (a surface counter to the electrode of the semiconductor substrate) or variation in the height of the bump itself is absorbed and reduced. Thereby, the contact between the bump and the second electrode can be made reliably, reproducibly and stably. Accordingly, the yield of the semiconductor modules can be improved and therefore the manufacturing cost of the semiconductor modules can be reduced.

In the second process in the above structure, after forming fine asperities on one surface of a plate-like metal as the plastic region, the bump may be formed by selectively removing the one surface thereof. According to this structure, a semiconductor module with further improved connection reliability between the bump of the metal sheet and the electrode of the semiconductor substrate can be easily manufactured. Thereby, the manufacturing cost of the semiconductor modules can be further reduced.

In the second process in the above structure, after the bump is formed by selectively removing one surface of a plate-like metal, fine asperities may be formed on the tip portion of the bump as the plastic region. According to this structure, a semiconductor module with further improved connection reliability between the bump of the metal sheet and the electrode of the semiconductor substrate can be easily manufactured and therefore the manufacturing cost of the semiconductor modules can be further reduced.

In the second process in the above structure, the plastic region may be formed by an electrolytic plating method or electroless plating method using gold. According to this structure, a semiconductor module with further improved connection reliability between the bump of the metal sheet and the electrode of the semiconductor substrate can be easily manufactured.

In the second process in the above structure, a shape of the bump may be formed in a manner such that the closer to a tip part thereof, the smaller a diameter thereof becomes, and in the third process the tip part of the bump may be plastic deformed so that it has a reversed mesa structure. By manufacturing the semiconductor module in this manner, when the metal sheet, the insulating layer and the semiconductor substrate are stacked by the press-bonding, the bump can be smoothly penetrated through the insulating layer without the medium of residual film of the insulating layer remaining at the interface between the bump of the metal sheet and the electrode of the semiconductor substrate. Also, when the bump of the metal sheet is connected to the electrode of the semiconductor substrate, the plastic region of the bump is plastic deformed and hence the tip of the bump can be easily formed into a reversed mesa structure. Accordingly, a semiconductor module with further improved connection reliability between the bump of the metal sheet and the electrode of the semiconductor substrate can be easily manufactured.

It is to be noted that any arbitrary combinations or rearrangement of the aforementioned structural components and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIGS. 7A to 7C are cross-sectional views showing connection states where a bump has a plastic region and the bump does not have it in an electrode portion of a semiconductor module;

FIGS. 8A and 8B are cross-sectional views showing connection states where a bump has a plastic region and the bump does not have it in an electrode portion of a semiconductor module;

DETAILED DESCRIPTION OF THE INVENTION

Figure 1:
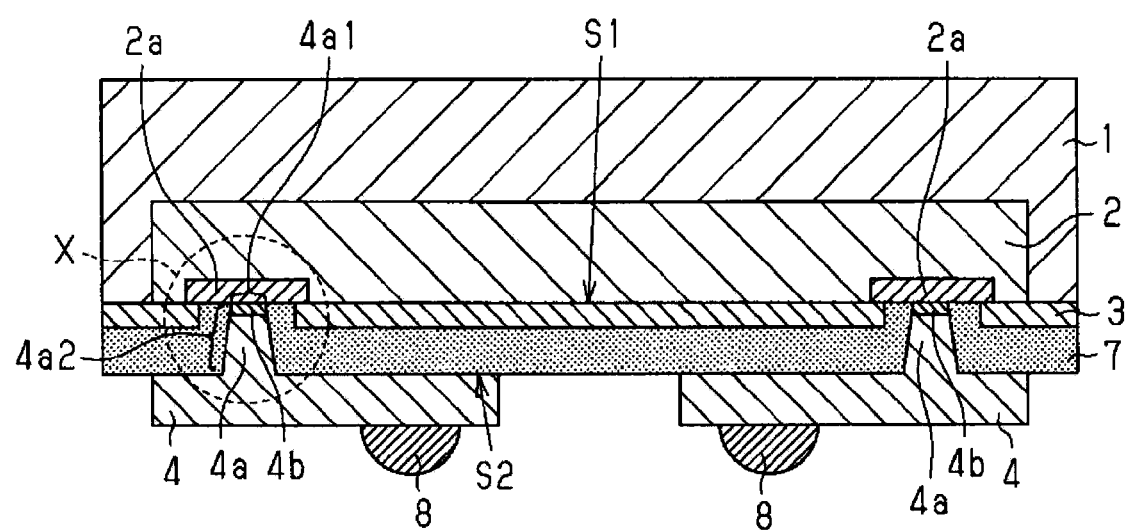
FIG. 1 is a schematic cross-sectional view showing a semiconductor module according to a first embodiment of the present invention.

The invention will now be described by reference to the preferred embodiments. This does not intend to limit the scope of the present invention, but to exemplify the invention.

Hereinbelow, the embodiments will be described with reference to the accompanying drawings. Note that in all of the Figures the same reference numerals are given to the same components and the description thereof is omitted as appropriate.

FIRST EMBODIMENT

Figure 2:
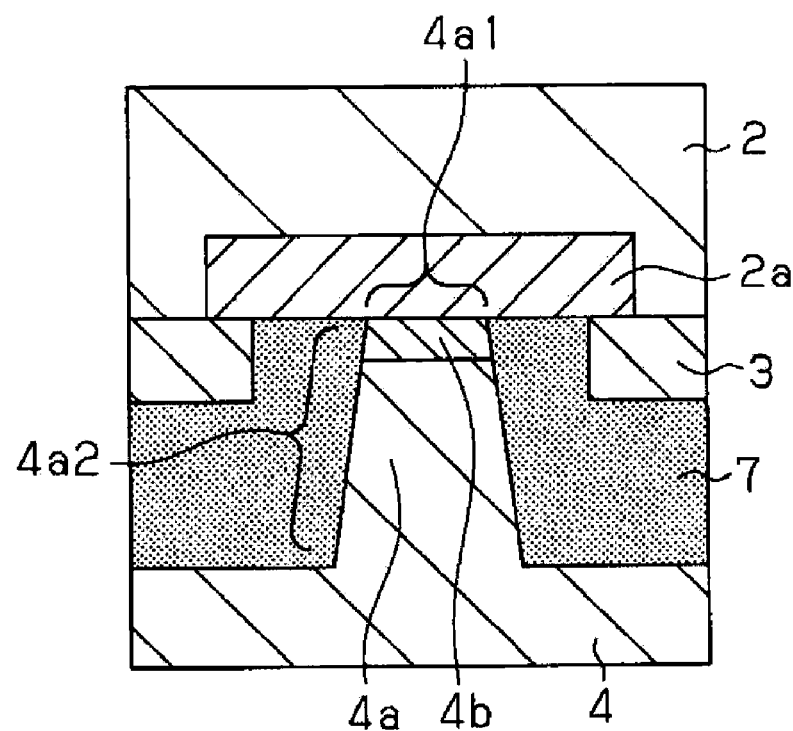
FIG. 2 is an enlarged cross-sectional view of an electrode portion of the semiconductor module shown in FIG. 1.

FIG. 1 is a schematic cross-sectional view showing a semiconductor module according to a first embodiment of the present invention. FIG. 2 is an enlarged cross-sectional view of an electrode portion (cross section of a part marked with X in FIG. 1) of the semiconductor module shown in FIG. 1. A semiconductor module according to the first embodiment will now be described based on FIG. 1 and FIG. 2.

A semiconductor substrate 1 to be employed is a p-type silicon substrate or the like. A semiconductor device 2, such as one containing a predetermined electric circuit, is formed on a surface S1 (bottom side) of the semiconductor substrate 1 by a known technology, and also electrodes 2a of the semiconductor device 2 are formed on the surface S1 (particularly in a peripheral part thereof), which is a packaging surface. A protective film 3 is formed on the area of the surface of the semiconductor substrate 1 except that of the electrodes 2a. On the surface S1 of the semiconductor substrate 1, an insulating layer 7 is formed on the electrodes 2a and the protective film 3 with the purpose of making the pitch of the electrodes 2a wider. And bumps (projecting conductor portions) 4a, which penetrate the insulating layer 7 and connect to the exposed surface of the electrodes 2a, and a rewiring pattern (wiring layer) 4, which is provided integrally with the bump 4a on a main surface 2 side of the rewiring pattern 4, are formed on the insulating layer 7 (or the surface S1 side of the semiconductor substrate 1). The bump 4a has a plastic region 4b on a tip part thereof. This plastic region 4b is plastic deformed, so that it is connected with the electrode 2a. External connection electrodes (solder bumps) 8 are provided on the opposite side (bottom side) of this main surface S2 of the rewiring pattern 4.

More specifically, the electrodes 2a are connected with an electric circuit that constitutes the semiconductor device 2. Also, the electrodes 2a are formed so that a plurality of electrodes 2a may be located in the periphery of the semiconductor device 2. The material generally used for the electrodes 2a is aluminum (Al) or copper (Cu).

The insulating layer 7 is formed on the surface S1 of the semiconductor substrate 1, and the thickness thereof is about 30 µm, for instance. The insulating layer 7 is made of a material that develops plastic flow when pressurized. An example of the material that develops plastic flow when pressurized is epoxy thermosetting resin. The epoxy thermosetting resin to be used for the insulating layer 7 may be, for example, one having a viscosity of 1 kPa·s under the conditions of 160° C. and 8 MPa. If a pressure of 15 MPa is applied to this material at a temperature of 160° C., then the viscosity of the resin will drop to about ⅛ of that before the pressurization. In contrast to this, an epoxy resin in B stage before thermosetting has no viscosity similarly to a case when the resin is not pressurized, and the epoxy resin develops no viscosity even when pressurized under a condition that the temperature is below a glass transition temperature Tg.

The rewiring pattern 4 is formed on the insulating layer 7. The rewiring pattern 4 is provided not only with the bump 4a formed integrally therewith, which projects from the main surface S2 and penetrates the insulating layer 7 but also with the plastic region 4b on the tip part. This plastic region 4b is formed integrally with the bump 4a, and the plasticity thereof is adjusted so that the plastic region 4b may be plastic deformed at a contact surface with the electrode 2a when the bump 4a and the electrode 2a of the semiconductor substrate 2a are press-bonded by way of the insulating layer 7. Here, the degree of plasticity or thickness of the plastic region 4b are controlled in such a manner that the grain size is reduced using a thermal treatment such as an RTA (Rapid Thermal Annealing) method. The rewiring pattern 4 and the bump 4a (which contains the plastic region 4b) may be formed using a rolled metal made of rolled copper, for example. The rolled copper made of copper performs excellently as a material for rewiring because it has greater mechanical strength than a copper-made metal film formed by plating or the like. The thickness of the rewiring pattern 4 is about 20 µm, for instance, and the height (thickness) of the bump 4a is about 30 µm, for instance. Of the height (thickness) of this bump 4a, the thickness of the plastic region 4b is about 5 µm, for instance. The bump 4a, which may be circular or round-shaped, has a head portion or tip part 4a1, whose surface is in parallel with the contact surface of the electrode 2a of the semiconductor substrate 1, and a side portion 4a2, which is formed in such a manner that the diameter is smaller toward the head portion 4a1. The diameters of the head (head portion 4a1) and the bottom plane of the bump 4a are about 40 µmφ and about 60 µmφ, respectively. Also, the bumps 4a are provided in positions corresponding to the electrodes 2a. The head (head portion 4a1) of the bump 4a is formed in such a manner as to directly contact the electrode 2a of the semiconductor substrate 1, thereby connecting the electrode 2a with the rewiring pattern 4 electrically by way of the bump 4a containing the plastic-deformed plastic region 4b. Note that an electrode 2a is an example of a "second electrode" or "electrode" of the present embodiment, a rewiring pattern 4 is an example of a "first electrode" of the present embodiment, a bump 4a is an example of a "bump" of the present embodiment, a plastic region 4b is an example of a "plastic region" of the present embodiment, and an insulating layer 7 is an example of an "insulating layer" of the present embodiment.

(Manufacturing Method)

FIGS. 3A to 3E are cross-sectional views for explaining a method for forming a copper sheet having bumps that contain plastic regions on the tip parts. FIG. 4 is a plan view showing a semiconductor wafer with semiconductor substrates, which are demarcated by a plurality of scribe lines, arranged in a matrix shape. FIGS. 5A to 5D and FIGS. 6A to 6C are schematic cross-sectional views for explaining a manufacturing process for a semiconductor module according to the first embodiment shown in FIG. 1. Now, with reference to FIGS. 3A through 6C, a description will be given of a manufacturing process of a semiconductor module according to the first embodiment.

Figure 3A:
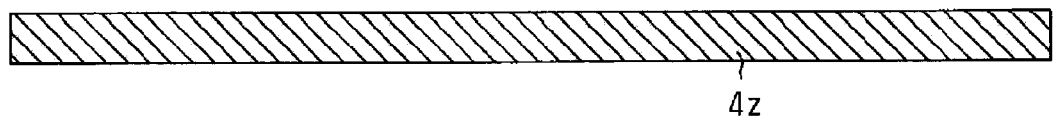
FIGS. 3A to 3E are cross-sectional views for explaining a method for forming a copper sheet having bumps that contain plastic regions in the tip parts.
Figure 4:
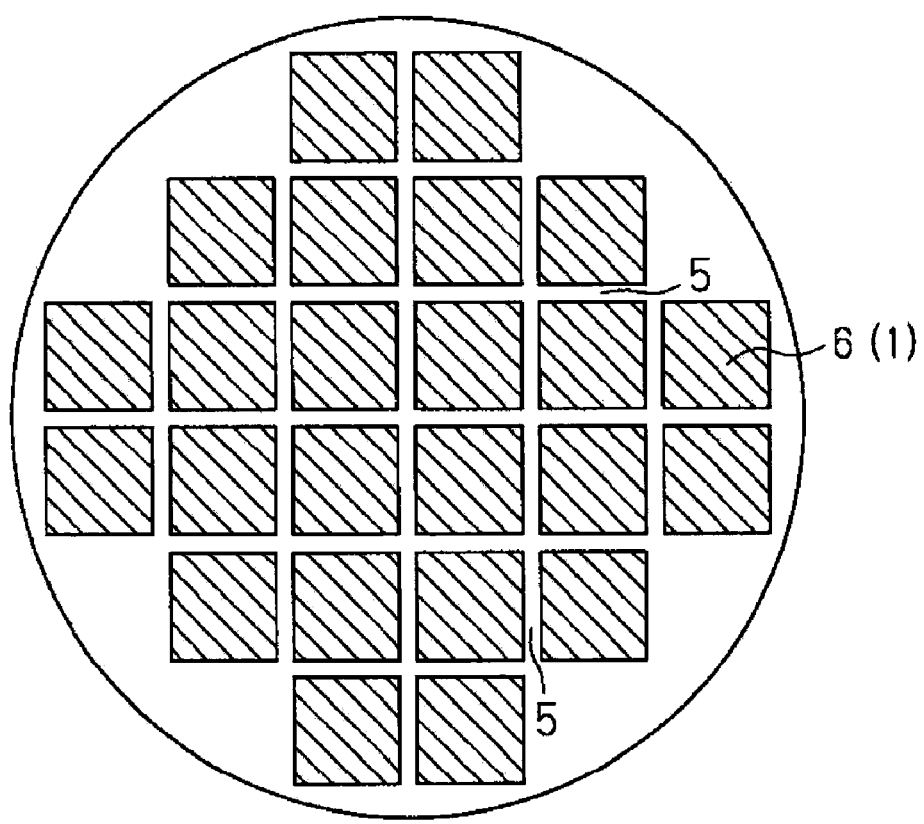
FIG. 4 is a plan view showing a semiconductor wafer with semiconductor substrates, which are demarcated by a plurality of scribe lines, arranged in a matrix shape.

As illustrated in FIG. 3A, a copper sheet 4z having a thickness greater than at least the sum of the height of the bumps (projecting conductor portions) 4a and the thickness of the rewiring pattern (wiring layer) 4 is first prepared. The thickness of the copper sheet 4z employed herein is about 100 µm. The rolled metal used for the copper sheet 4z is a rolled copper.

Figure 3B:
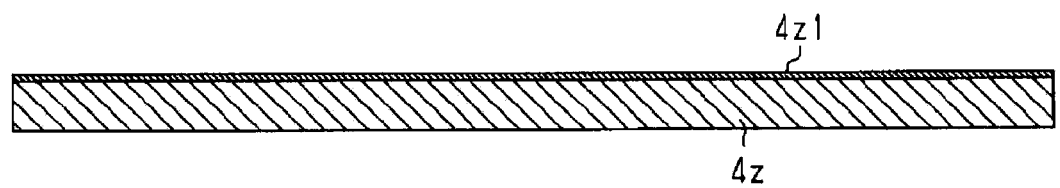

As illustrated in FIG. 3B, rapid heating and fast cooling by the RTA method are continuously applied on one surface side of the copper sheet 4z so as to reduce the grain size of copper crystals on the surface of the copper sheet 4z. As a result, a heat treated layer 4z1, of about 5 µm in thickness, which will later become a plastic region of a bump are formed on the surface of the copper sheet 4z. The degree of plasticity of the heat treated layer 4z1 is such that the plasticity thereof is greater than that of the copper sheet 4z made of rolled copper. Note that the degree of plasticity or the thickness of the heat treated layer 4z1 can be easily controlled by adjusting a heat treatment condition.

Figure 3C:
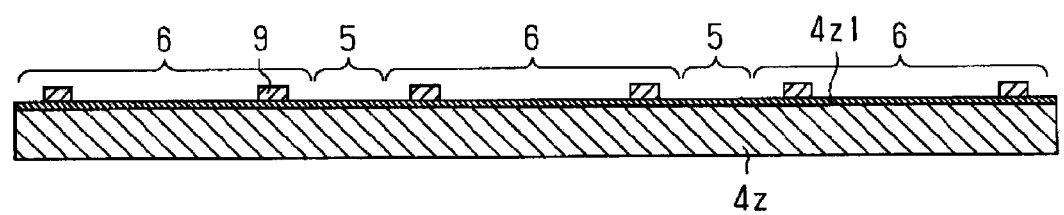

As illustrated in FIG. 3C, a resist mask 9 is formed over a bump forming portion in a semiconductor module forming region 6 by an ordinary lithography method. Here, the bump forming portions are so arranged that they correspond to the positions of electrodes 2a on semiconductor substrates 1 in a semiconductor wafer demarcated into a plurality of semiconductor module forming regions 6 by a plurality of scribe lines 5.

Figure 3D:
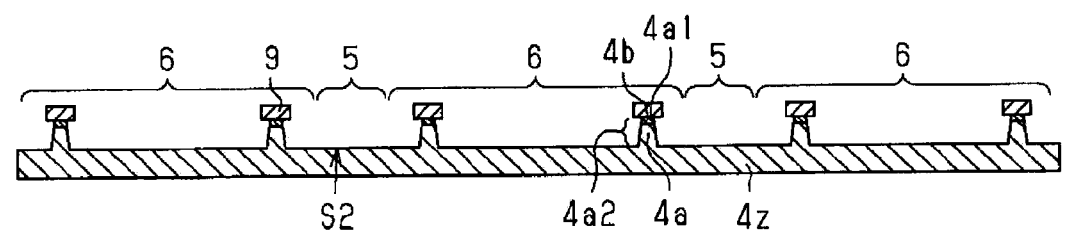

As illustrated in FIG. 3D, an etching is performed using the resist mask 9 as a mask to form a bump 4a, having a plastic region 4b on the tip part thereof, in a predetermined pattern such that the bump 4a project from the main surface S2 of the copper sheet 4z. At this time, an etching condition is adjusted in a manner that each bump 4a is formed with the side portion 4a2 thereof growing smaller in diameter toward the head portion 4a1 thereof. As used herein, the height of the bump 4a is about 30 µm, and the diameters of the head (head portion or tip part 4a1) and the bottom plane thereof are about 40 µmφ and about 60 µmφ, respectively. The thickness of the plastic region 4b is about 5 µm, which reflects the thickness of the heat treated layer 4z1. Note also that the copper sheet 4z provided with the bumps 4a is one example of "metal sheet" of the present embodiment.

Figure 3E:
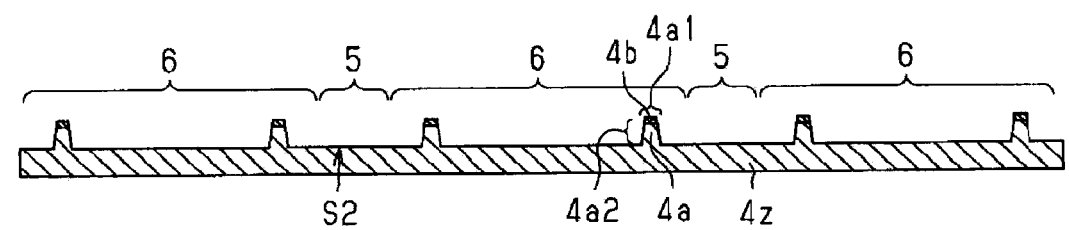

As illustrated in FIG. 3E, the resist mask 9 is removed. As a result, the bump 4a having a head portion 4a1 and a side portion 4a2, which is formed in such a manner that the diameter is smaller toward the head portion 4a1, is formed on the copper sheet 4z wherein the bump 4a has the plastic region 4b on the tip part thereof. It is to be noted that a metal mask of silver (Ag) may be used instead of the resist mask 9. In such a case, etch selectivity in relation to the copper sheet 4z can be amply secured, so that finer patterning of the projections 4a can be realized.

The copper sheet 4z manufactured as described above is prepared separately, and it is used in a fabrication process of a semiconductor module according to the first embodiment, which will now be described below. Note that the semiconductor wafer, as shown in FIG. 4, is demarcated into grids of a plurality of semiconductor module forming regions 6 (semiconductor substrates 1) by a plurality of scribe lines 5. The semiconductor module forming regions 6 are the regions where semiconductor modules as described earlier are formed.

Figure 5A:
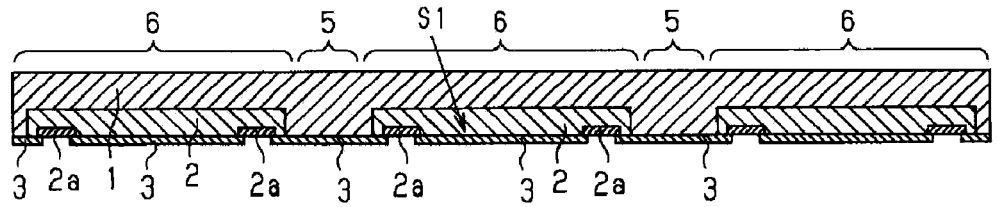
FIGS. 5A to 5D are schematic cross-sectional views for explaining a manufacturing process for a semiconductor module according to a first embodiment of the present invention.

Firstly, as illustrated in FIG. 5A, a semiconductor wafer with semiconductor substrates 1, each including a circuit element 2, electrodes 2a and a protective film 3, formed in a matrix shape at the surface S1 is prepared.

More specifically, as illustrated in FIG. 5A, for each of the semiconductor substrates 1, such as a p-type silicon substrate, within a semiconductor wafer, a semiconductor device 2, such as a predetermined electric circuit, is formed on the surface S1 (bottom side) thereof by a known technology. Also, electrodes 2a are formed in the peripheral or top part of the semiconductor device 2. The material generally used for the electrodes 2a is metal such as aluminum (Al) or copper (Cu). The protective film 3 insulating to protect the semiconductor substrate 1 is formed on the area of the surface S1 of the semiconductor substrate 1 except that of the electrodes 2a. As the protective film 3, a silicon dioxide film ($SiO_2$), a silicon nitride film (SiN) or the like is employed. Note also that the semiconductor substrate 1 is one example of "semiconductor substrate" of the present embodiment.

Figure 5B:
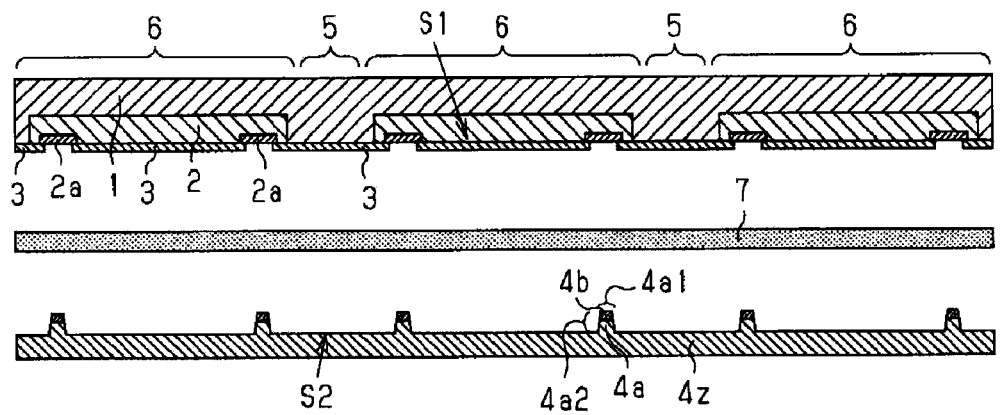

As illustrated in FIG. 5B, at the surface S1 of the semiconductor wafer (semiconductor substrate 1), an insulating layer 7 is held between the semiconductor substrate 1 and the copper sheet 4z which has bumps 4a (having the plastic region 4b on the tip thereof) formed integrally therewith. The thickness of the insulating layer 7 is about 30 µm, or about the same as the height of the bumps 4a. Note that the method for forming a copper sheet 4z having the bumps 4a that contain plastic regions 4b is as described earlier.

Figure 5C:
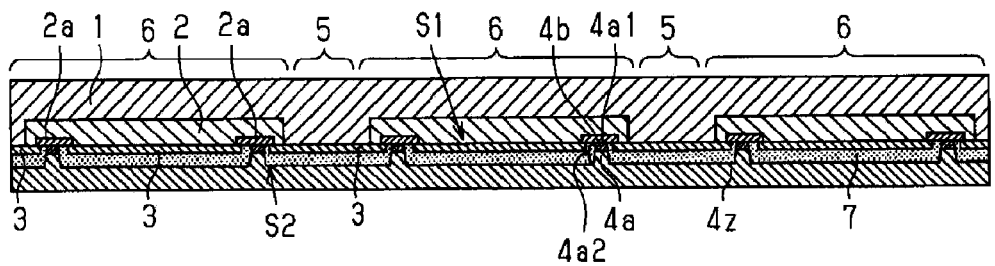

As illustrated in FIG. 5C, the semiconductor substrate 1, the insulating layer 7 and the copper sheet 4z, held together as described above, are now press-formed by a press machine into a single block. The pressure and the temperature for the press-forming are about 5 MPa and 200° C., respectively. The press-forming causes a drop in viscosity of the insulating layer 7, which sets off plastic flow therein. As a result, the bumps 4a penetrate the insulating layer 7 and the plastic region 4b on the tip thereof is plastic deformed at the contact surface with the electrode 2a, thus electrically connecting the bumps 4a with the electrodes 2a of the semiconductor substrate 1. The projection 4a, which has a side portion 4a2 formed with increasingly smaller diameter toward the head portion 4a1, penetrates the insulating layer 7 smoothly. All these arrangements make it possible to push insulating layer 7 effectively out of the interface between the bumps 4a and the electrodes 2a of the semiconductor substrate 1, thus making it harder for part of the insulating layer 7 to remain at the interface.

Figure 5D:
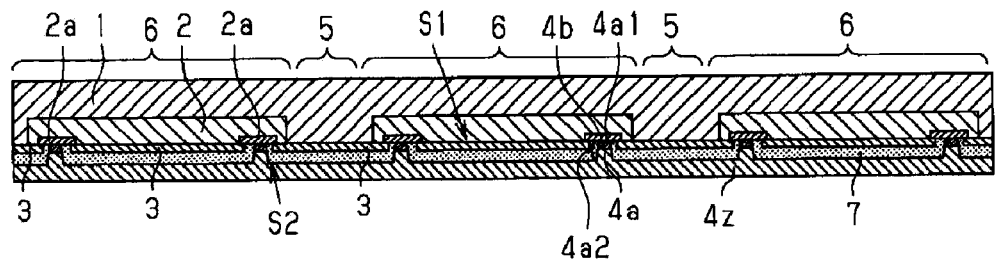

As illustrated in FIG. 5D, the copper sheet 4z is adjusted into the thickness of a rewiring pattern 4 by etching the whole of the copper sheet 4z from the opposite side of the main surface S2. The thickness of the rewiring pattern 4 according to this embodiment is about 20 µm.

Figure 6A:
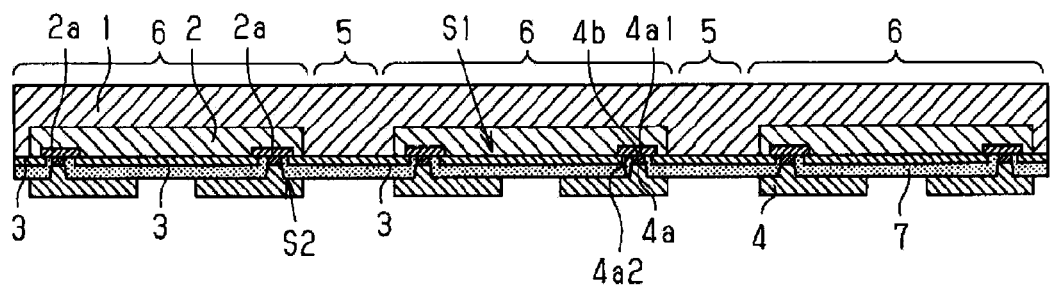
FIGS. 6A to 6C are schematic cross-sectional views for explaining a manufacturing process for a semiconductor module according to a first embodiment of the present invention.

Next, as illustrated in FIG. 6A, the copper sheet 4z is processed into a rewiring pattern (wiring layer) 4 with a predetermined line/space pattern, using a photolithography and etching technique.

To be more precise, a resist film of about 10 μm in thickness is affixed to the copper sheet 4z, using a laminator, and is exposed using a photomask having a predetermined line/space pattern. Then the resist film in unexposed regions is removed by a development process using $Na_2CO_3$ solution, so that a resist mask (not shown) is formed selectively on the copper sheet 4z. Note here that it is desirable to perform a preprocessing, such as polishing or cleaning, on the surface of the copper sheet 4z, as need arises, before the lamination of the resist film in order to improve the adhesiveness to the resist mask. Following this, the exposed parts of the copper sheet 4z are etched with a ferric chloride solution to form the rewiring pattern (wiring layer) 4 having a predetermined line/space pattern. After this, the resist mask is removed, using a remover, such as an NaOH solution.

Figure 6B:
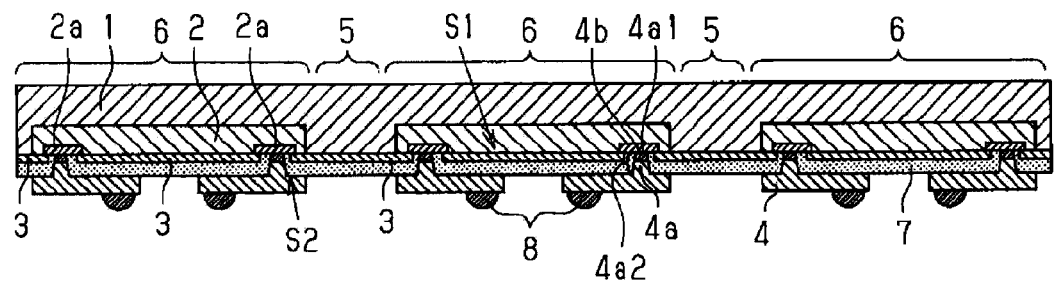

As illustrated in FIG. 6B, external connection electrodes (solder balls) 8, which function as external connection terminals for the parts of rewiring pattern 4 connected to the electrodes 2a via the bumps 4a, are formed by employing a solder printing method. More specifically, the external connection electrodes (solder balls) 8 are formed by printing "soldering paste", which is a pasty mixture of resin and solder material, in desired positions through a screen mask and then heating the printed paste to a solder melting point. As another method, a flux may be applied in advance to the rewiring pattern 4 side, and then solder balls may be mounted on the rewiring pattern 4. Here, the connection between the bump 4a and the electrode 2a is made by way of the plastic region 4b and no presence of conventional solder pastes is required there. Hence, the occurrence of remelting as a result of a heat treatment performed when such external connection electrodes (solder balls) are formed is suppressed and thereby the deterioration of connection between the bump 4a and the electrode 2a are also suppressed. Also, the surface other than a solder ball forming region may be covered with a solder resist (not shown).

Figure 6C:
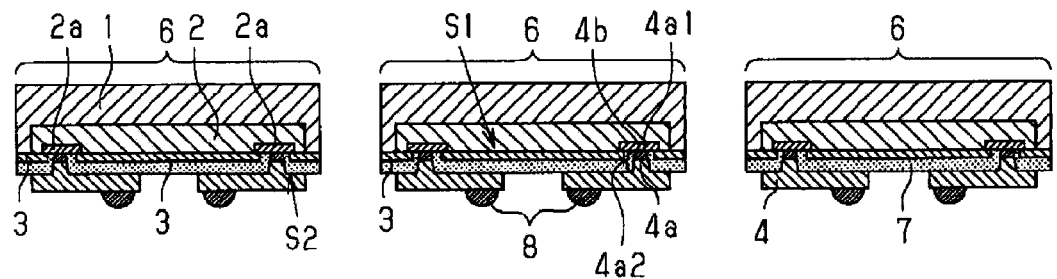

As illustrated in FIG. 6C, a semiconductor wafer is divided into individual semiconductor modules, each having the same outside dimensions as those of the semiconductor substrate 1, by dicing the semiconductor wafer from the back side (top side) thereof along the scribe lines 5 demarcating a plurality of semiconductor module forming regions 6. After that, the residues or the like resulting from the dicing are removed by a cleaning processing using a chemical.

Through these processes, a semiconductor module of the first embodiment as shown in FIG. 1 is manufactured.

Now the usability of the plastic region will now be described hereinbelow.

FIGS. 7A to 7C and FIGS. 8A and 8B are cross-sectional views showing connection states where the bump has a plastic region and the bump does not have it in an electrode portion of a semiconductor module. FIGS. 7A to 7C represent a case where the head surface of the bump 4a, which is a surface counter to the electrode 2a of the semiconductor substrate 1, is tilted. FIGS. 8A and 8B represent a case where the surface of the electrode 2a has fine roughness or fine asperities.

If the head surface of the bump 4a is tilted, there may be cases where the head portion of the bump 4a is only in contact with part of the electrode 2a as shown in FIG. 7A or the head portion of the electrode 2a is embedded in the electrode 2a as shown in FIG. 7B, unless the plastic region 4b is provided in the head portion of the bump 4a. Such a connection state as shown in FIG. 7A causes the connection resistance to rise significantly above a designed value. In such a connection state as in FIG. 7B, a crack may be caused in the electrode 2a. Accordingly, the reliability of the semiconductor module is significantly degraded in each connection state. In contrast thereto, with the provision of the plastic region 4b on a tip part of the bump 4a, the plastic region 4b of the bump 4a is plastic-deformed in a manufacturing process to increase the contact area thereof with the contact area of the electrode 2a. As a result, the tip part of the bump 4a is connected excellently with the electrode 2a. The plastic region 4b of the bump 4a is plastic deformed, thus simultaneously suppressing the bump 4a from biting into the electrode 2a.

Also, if the surface of the electrode 2a has the fine asperities, the head portion of the bump 4a will be only in contact with a salient on the surface of the electrode 2a as shown in FIG. 8A, unless the plastic region 4b is provided in the head portion of the bump 4a. This causes the connection resistance to rise depending on the state of fine asperities, thus lowering the reliability of the semiconductor module. In contrast thereto, with the provision of the plastic region 4b on a tip part of the bump 4a, the plastic region 4b of the bump 4a is plastic-deformed in a manufacturing process and is therefore filled into recesses on the surface of the electrode 2a. As a result, the head portion of the bump 4a is connected excellently with the electrode 2a as shown in FIG. 8B.

The following advantageous effects are produced by employing the semiconductor module and the manufacturing method thereof according to the first embodiment:

(1) The rewiring pattern 4 and the electrode 2a of the semiconductor substrate 1 are connected together through the medium of the bump 4a, having the plastic region 4b in the head portion, which is formed integrally with the rewiring pattern 4 (a copper sheet 4z before being processed). Thereby, the disconnection at a contact surface (interface) between the rewiring pattern 4 and the electrode 2a or the like that may occur due to a temperature change caused by a heat treatment or the like is suppressed, so that the connection reliability between the rewiring pattern 4 and the electrode 2a improves. The reason for this advantageous effect is as follows. Since the bump 4a containing the plastic region 4b therein is formed integrally with the rewriting pattern 4, the interface (contact surface) no longer exists between the bump 4a and the plastic region 4b. This suppresses the stress loading caused by thermal expansion that occurs when a conventional adhesion layer such as solder paste is used. Also, the plastic deformed bump 4a (plastic region 4b in the tip part) contributes to an increase in contact area of the interface with the electrode 2a and therefore the adhesion between the bump 4a and the electrode 2a improves.

(2) The bump 4a (rewiring pattern 4) and the electrode 2a are each formed by the metal composed of the same copper (Cu), so that the thermal expansion coefficients of the bump 4a and the electrode 2a become identical to each other. Thereby, the connection reliability for the heat stress of the semiconductor module can be further improved.

(3) A semiconductor module is manufactured by press-bonding the copper sheet 4z with which the bump 4a having the plastic region 4b in the tip part is integrally formed. As a result, a semiconductor module with improved connection reliability for the heat stress can be easily manufactured as compared with a case where the conventional adhesion layer such as solder paste is employed.

(4) At the time when the copper sheet 4z is press-bonded, the plastic region 4b in the tip part of the bump 4a is plastic deformed at a contact surface with the electrode 2a of the semiconductor substrate 1. As a result, a variation in the degree of parallelization of a tip surface of the bump 4a in a manufacturing process (a surface counter to the electrode 2a of the semiconductor substrate 1) or variation in the height of the bump itself is absorbed and reduced. Thereby, the contact between the bump 4a and the electrode 2a can be made reliably, reproducibly and stably. Accordingly, the yield of the semiconductor modules can be improved and therefore the production cost of the semiconductor modules can be reduced.

(5) The plastic region 4b of the bump 4a is formed so that the plasticity of the plastic region 4b is larger than that of the bump 4a. This makes it easy for the plastic region 4b of the bump 4a to be plastic deformed at the contact surface with the electrode 2a of the semiconductor substrate 1. As a result, the contact area at the interface between the bump 4a and the electrode 2a increases. Thereby the semiconductor module characterized by improved adhesion in the portion (interface) is easily manufactured.

(6) Rewiring patterns (wiring layers) 4, each having bumps 4a and plastic regions 4b, are formed all together in the state of a semiconductor wafer before it is divided into individual semiconductor modules. Therefore, the production cost of the semiconductor module can be made lower than when the rewiring pattern 4 is formed individually for each semiconductor module.

SECOND EMBODIMENT

Figure 9:
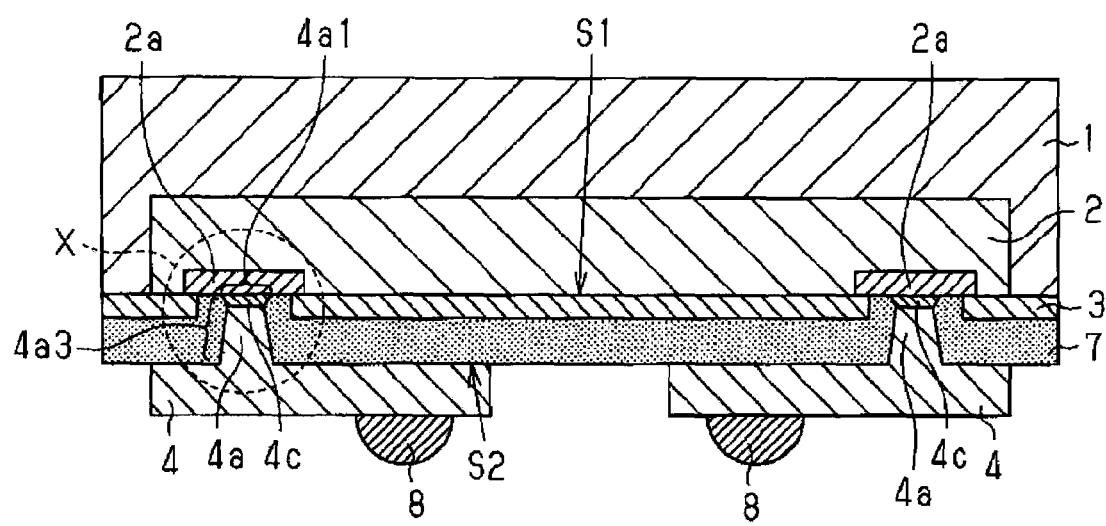
FIG. 9 is a schematic cross-sectional view of a semiconductor module according to a second embodiment of the present invention.
Figure 10:
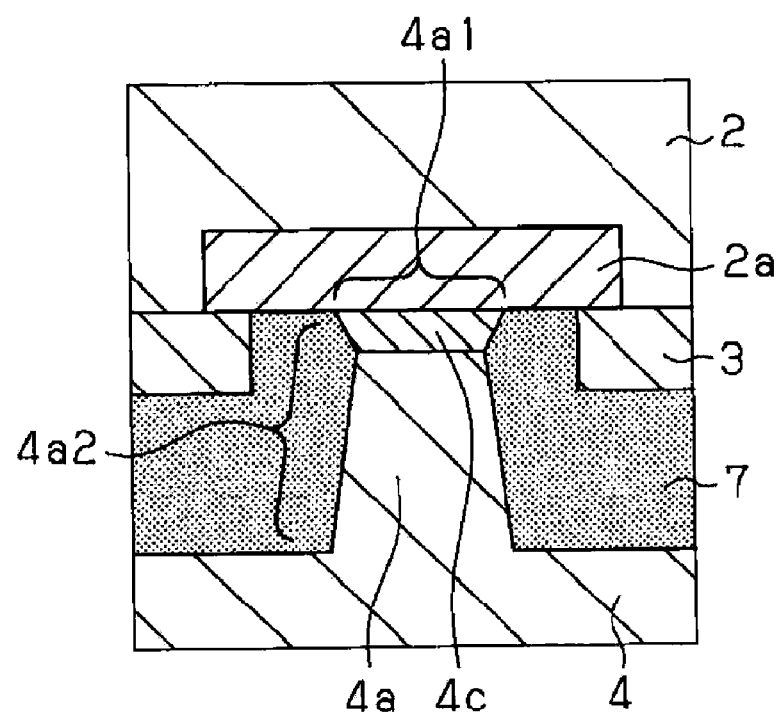
FIG. 10 is an enlarged cross-sectional view of an electrode portion of the semiconductor module shown in FIG. 9.

FIG. 9 is a schematic cross-sectional view for explaining a semiconductor module according to a second embodiment of the present invention. FIG. 10 is an enlarged cross-sectional view of an electrode portion (cross section of a part marked with X in FIG. 9) of the semiconductor module shown in FIG. 9. What differs from the first embodiment lies in the shape of a bump 4a (bump 4a containing a plastic region 4c) after press-bonding and also lies in the features that the plastic region 4c is deformed extending also in a lateral direction along with a contact surface with the electrode 2a when the plastic region 4c is plastic deformed and the shape of a tip of the bump 4a is of a reversed mesa structure. Here, the reversed mesa structure is a shape such that the diameter of part of the plastic region is at least larger than that of a portion in the vicinity of the plastic region of the bump.

The bump 4a having the plastic region 4c as described above can be easily manufactured, for example, by increasing the pressure used when it is press-formed using a press machine as shown in FIG. 5C. Those other than the bump 4a are of the same structure as that described in the first embodiment and are manufactured the same way as described in the first embodiment.

The following advantageous effects, in addition to those cited in (1) to (6) in the description of the first embodiment, are produced by employing the semiconductor module and the manufacturing method thereof according to the second embodiment:

(7) The shape of a tip of the bump 4a is formed into a reversed mesa structure by plastic deformation. Thereby the migration of the bump 4a in the insulating layer 7 to a penetrating direction is suppressed by an anchor effect of the bump 4a containing the plastic region 4c, thus making it difficult for the bump 4a to pass through the insulating layer 7. As a result, adhesion between the bump 4a and the electrode 2a of a semiconductor substrate 1 is improved and hence the connection reliability for the heat stress of the semiconductor module can be further improved.

(8) Before the press-bonding, the bump 4a is formed in a manner such that the diameter thereof becomes smaller toward a tip part 4a1. After the press-bonding, the bump 4a is plastic deformed in a manner such that the shape of the tip part 4a becomes a reversed mesa structure. Thereby, when the copper sheet 4z, the insulating layer 7 and the semiconductor substrate 1 are stacked by the press-bonding, the bump 4a can be smoothly penetrated through the insulating layer 7 without the medium of residual film of the insulating layer remaining at the interface (contact surface) between the bump 4a of the copper sheet 4z and the electrode 2a of the semiconductor substrate 1. Also, when the bump 4a of the copper sheet 4z is connected to the electrode 2a of the semiconductor substrate 1, the plastic region 4b of the bump 4a is plastic deformed and hence the tip of the bump 4a can be easily formed into a reversed mesa structure. As a result, a semiconductor module with further improved connection reliability between the bump 4a of the copper sheet 4z (rewiring pattern 4) and the electrode 2a of the semiconductor substrate 1 can be easily manufactured.

THIRD EMBODIMENT

Although the bump 4a is formed by the RTA method in the above-described first embodiment, a plastic region 4d may be formed according to a third embodiment. A description will now be given of a method for forming the plastic region 4d according to a third embodiment.

FIGS. 11A to 11E are cross-sectional views for explaining a method for forming a copper sheet having bumps that contain plastic regions in a semiconductor module according the third embodiment of the present invention.

Figure 11A:
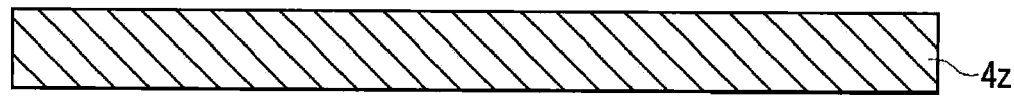
FIGS. 11A to 11E are cross-sectional views for explaining a method for forming a copper sheet having bumps that contain plastic regions according a third embodiment of the present invention.

As illustrated in FIG. 11A, a copper sheet 4z having a thickness greater than at least the sum of the height of the bumps 4a and the thickness of the rewiring pattern 4 is prepared first.

Figure 11B:
Figure 11C:
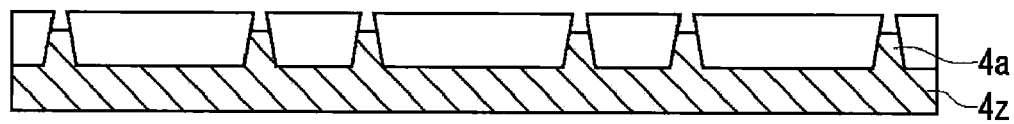

As illustrated in FIG. 11B, a resist mask (not shown) is selectively formed over a bump forming portion by a lithography method. An etching is performed using this resist mask as a mask to form a bump 4a, having a predetermined pattern, on the copper sheet 4z.

As illustrated in FIG. 1C, a resist is laminated on a bump 4a side of the copper sheet 4z, this resist is exposure-developed by the lithography method using a photomask so as to open the resist positioned above the bump 4a.

Figure 11D:
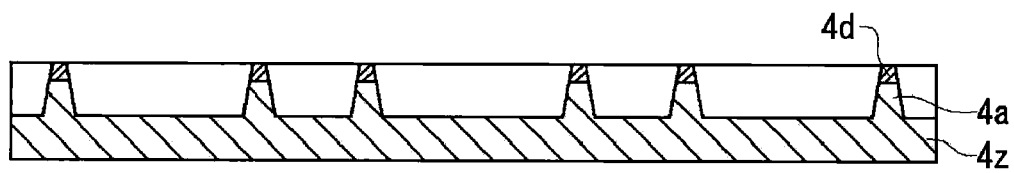
Figure 11E:
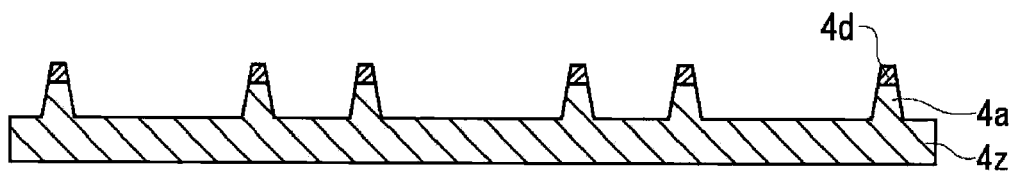

As shown in FIG. 11D, a plastic region 4d is formed within an opening of the resist. The plastic region 4d is formed by electrolytic plating or electroless plating as a metallic layer which is formed of metal more plastic-deformable than the bump 4a. Here, the plastic region 4d is formed as a metallic layer preferably made of gold (Au), for example, as an Au/Ni layer. The film thickness of Au and Ni are, for instance, 0.5 µm and 3.0 µm, respectively. In so doing, if the plastic region 4d is formed in a manner that it grows smaller in diameter toward the tip part thereof, a negative resist can be used for example as the resist and an opening can be provided by performing the selective exposure of the resist in an underexposed condition so as to form a metallic layer within the opening. Alternatively, the resist can be provided with an opening larger than the size of plastic region 4d and the plastic region 4d of a similar shape can be formed by performing an etching on said metallic layer. Note that the method for forming the plastic region 4d is not limited to the above-described one and, for example, it may be formed using conducive paste such as copper paste, silver paste and gold paste.

As illustrated in FIG. 1E, the resist mask is removed. As a result, the bump 4a with a plastic region 4d formed thereon is formed on the copper sheet 4z.

The following advantageous effects, in addition to those cited in (1) to (6) in the description of the first embodiment and those cited in (7) and (8) in the second embodiment, are produced by employing the semiconductor module and the manufacturing method thereof according to the third embodiment:

(9) The plastic region 4d is formed of gold. This makes it easier for the plastic region 4d to be plastic deformed at the contact surface with the electrode 2a of the semiconductor substrate 1 when the copper sheet 4z is press-bonded. As a result, the contact area at the interface between the bump 4a and the electrode 2a increases. Thereby the connection reliability between the bump 4a and the electrode 2a further improves.

(10) A gold plating film serving as a plastic region 4d is formed by electrolytic plating or electroless plating. As a result, it can be formed at lower cost compared with a case where it is formed by a sputtering and the like.

FOURTH EMBODIMENT

Next, a description will be given of a mobile apparatus (portable device) provided with a semiconductor module according to an embodiment. The mobile apparatus presented as an example herein is a mobile phone, but it may be any electronic apparatus, such as a personal digital assistant (PDA), a digital video cameras (DVC) or a digital still camera (DSC).

Figure 12:
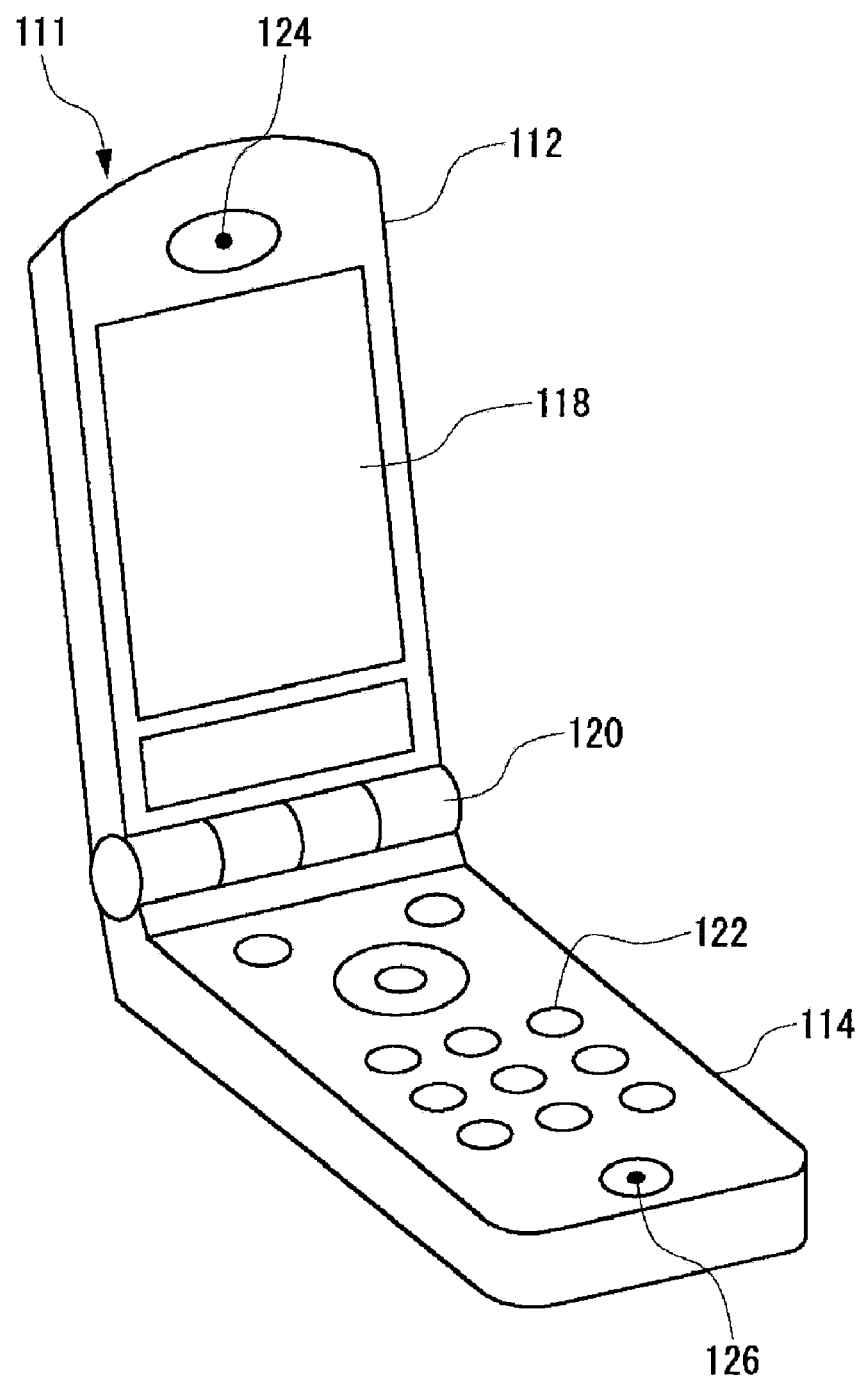
FIG. 12 illustrates a structure of a mobile phone according to a fourth embodiment of the present invention.

FIG. 12 illustrates a structure of a mobile phone provided with a semiconductor module according to the preferred embodiments of the present invention. A mobile phone 111 has a basic structure of a first casing 112 and a second casing 114 jointed together by a movable part 120. The first casing 112 and the second casing 114 are turnable/rotatable around the movable part 120 as the axis. The first casing 112 is provided with a display unit 118 for displaying characters, images and other information and a speaker unit 124. The second casing 114 is provided with a control module 122 with operation buttons and a microphone 126. Note that a semiconductor module according to the preferred embodiments of the present invention is mounted within a mobile phone 110 such as this.

Figure 13:
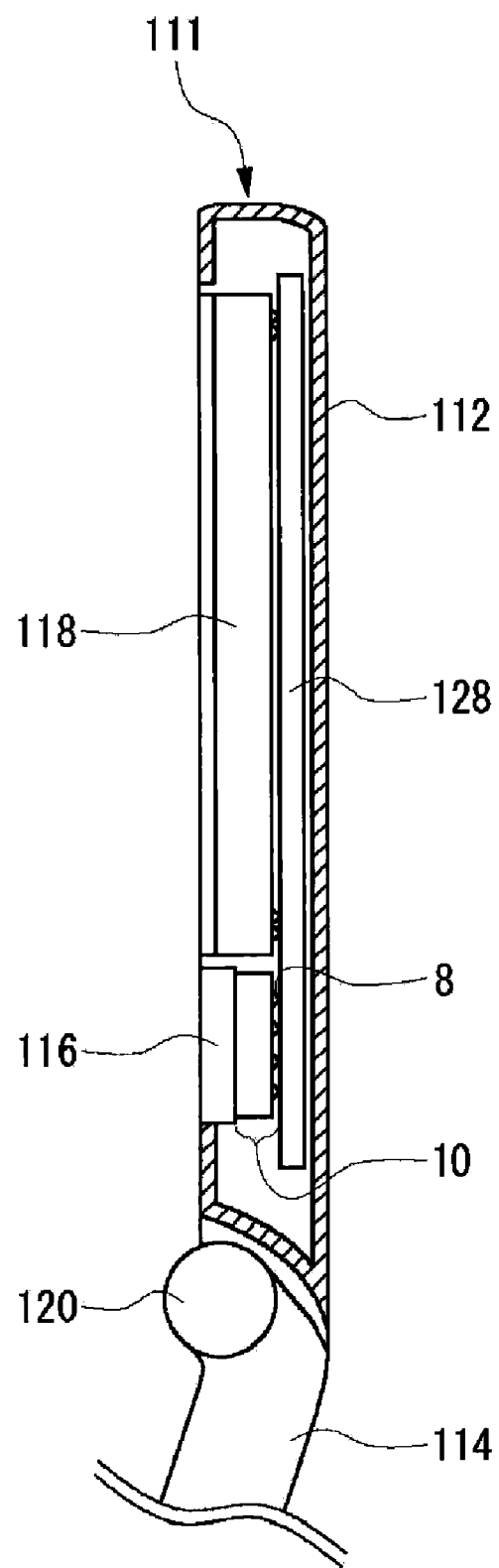
FIG. 13 is a partial cross-sectional view of a mobile phone.

FIG. 13 is a partially schematic cross-sectional view (cross-sectional view of a first casing 112) of the mobile phone shown in FIG. 12. A semiconductor module 130 according to each of the preferred embodiments of the present invention is mounted on a printed circuit board 128 via external connection electrodes 9, and is connected electrically to a display unit 118 and the like by way of the printed circuit board 128. Also, a radiating substrate 116, which may be a metallic substrate, is provided on the back side of the semiconductor module 130 (opposite side of external connection electrodes 8), so that the heat generated from the semiconductor module 10, for example, can be efficiently released outside the first casing 112 without getting trapped therein.

The following advantageous effects are produced by the mobile apparatus provided with he semiconductor module according to the embodiments:

(11) The connection reliability between the bump 4a and the electrode 2a is improved and thereby the connection reliability of the semiconductor module is improved. As a result, the reliability of the mobile apparatus with such a semiconductor module mounted thereon is improved.

(12) The manufacturing cost of the semiconductor modules is reduced, so that the manufacturing cost of the mobile apparatus that mounts such a semiconductor module thereon can be suppressed.

The present invention is not limited to the above-described embodiments only, and it is understood by those skilled in the art that various modifications such as changes in design may be made based on their knowledge and the embodiments added with such modifications are also within the scope of the present invention. For example, the structure of each embodiment may be combined as appropriate.

In the above-described first and second embodiments, examples have been shown where the thermal treatment layer 4z1 which will serve as the plastic region 4b is formed on the surface of the copper sheet 4z by subjecting it to the rapid heating and fast cooling by the RTA method and then the copper sheet 4z containing the heat treated layer 4z1 is patterning-processed so as to form the bump 4a (the bump having the plastic region 4b). However, this should not be considered as limiting and, for example, the bump may be formed as follows. That is, impurities may be introduced using ion implantation method, thermal diffusion or the like method and then the copper sheet 4z containing an impurity layer may be patterning-processed so as to form the bump. Also, a structure may be such that fine asperities on the order of submicron are provided on the surface of the copper sheet 4z by a chemical treatment using acid or the like and the fine asperities are used as the plastic region. A bump having the plastic region thus formed accordingly can also produce the same advantageous effects as those described above. Here, the fine asperities on the order of submicron may be, for example, such that Rz (ten points average height, peak to valley average) is selected in a range from 0.2 to 2 μm. If the fine asperities are smaller than 0.2 μm Rz, a desired effect will not be obtained as a plastic region when the fine asperities are deformed. If larger than 2 μm Rz, a sufficient plastic deformation of the fine asperities will not be obtained. Hence, the fine asperities are preferably within the above range.

Also, in the above-described first and second embodiments, examples have been shown where the thermal treatment layer 4z1 which will serve as the plastic region 4b is formed and then the copper sheet 4z containing the heat treated layer 4z1 is patterning-processed so as to form the bump 4a. However, this should not be considered as limiting and, for example, the copper sheet 4z may be patterning-processed so as to form a bump and then the plastic region may be formed uniformly on the surface of the bump by subjecting the bump to the rapid heating and fast cooling by the RTA method. In this case, too, the above-described advantageous effects can be produced.

In each of the above-described embodiments, an example has been shown where the bump 4a of the copper sheet 4z is circular or round-shaped and it is formed in such a manner that the diameter is smaller toward the head portion 4a1. However, this should not be considered as limiting and, for example, the bump may be in the shape of a cylinder with a predetermined diameter. Also, although the bump 4a used here is of a circular shape, the bump 4a may be polygonal, such as quadrangular. In such a case, too, the probability that the residual film of insulating layer 7 will remain at the interface between the bumps 4a and the electrodes 2a is suppressed. Thus, the connection reliability of the semiconductor module can be improved.

As an example presented in each of the above-described embodiments, with the purpose of having the pitch of the electrodes 2a of the semiconductor substrate 1 (or semiconductor device 2) wider, the copper sheet 4z, the insulating layer 7 and the semiconductor device 2 are stacked in such a manner that the bumps 4a containing the plastic regions 4b and 4c are embedded in the insulating layer 7, and the rewiring pattern (wiring layer) 4 is formed and the external connection electrodes (solder balls) 8 are formed on the back side thereof. However, this should not be considered as limiting, and a multilayer structure may be constructed, for instance, by forming a wiring layer repeatedly using a copper sheet having bumps. Such an arrangement can achieve a buildup of multilayer wiring easily and, at the same time, improve the connection reliability within the multilayer wiring and the connection reliability between the multilayer wiring and the semiconductor device.

While the preferred embodiments of the present invention have been described using specific terms, such description is for illustrative purposes only, and it is to be understood that changes and variations may be made without departing from the spirit or scope of the appended claims.

What is claimed is:

1. A semiconductor module, comprising:
   an insulating layer;
   a first electrode provided on a surface of said insulating layer;
   a second electrode provided on the other surface of said insulating layer; and
   a bump electrically connected with said second electrode by penetrating said insulating layer, said bump being provided integrally with said first electrode,
   wherein said bump has a plastic region on a tip part thereof and the plastic region is plastic deformed and connected with said second electrode.

2. A semiconductor module according to claim 1, wherein said bump and said second electrode are made of a same metal.

3. A semiconductor module according to claim 1, wherein said first electrode and said bump are formed using a rolled metal.

4. A semiconductor module according to claim 1, wherein the plastic region includes fine asperities formed on the tip part of said bump.

5. A semiconductor module according to claim 1, wherein the plastic region is made of metal which is more plastic-deformable than portions except for the plastic region of the bump.

6. A semiconductor module according to claim 5, wherein the plastic region is made of gold.

7. A semiconductor module according to claim 1, wherein the tip part of said bump is of a reversed mesa structure realized by a plastic deformation of the plastic region.

8. A mobile apparatus which mounts a semiconductor module according to claim 1.

9. A method for manufacturing a semiconductor module, the method comprising:
   a first process of preparing a semiconductor substrate having an electrode on a surface thereof;
   a second process of forming a metal sheet with which a bump having a plastic region on a tip thereof is provided integrally; and
   a third process of press-bonding the metal sheet and the semiconductor substrate by way of an insulating layer and electrically connecting the bump with the electrode in a manner such that the bump penetrates the insulating layer and the plastic region is plastic deformed.

10. A method for manufacturing a semiconductor module according to claim 9, wherein, in said second process, after forming fine asperities on one surface of a plate-like metal as the plastic region, the bump is formed by selectively removing the one surface thereof.

11. A method for manufacturing a semiconductor module according to claim 9, wherein, in said second process, after the bump is formed by selectively removing one surface of a plate-like metal, fine asperities are formed on the tip portion of the bump as the plastic region.

12. A method for manufacturing a semiconductor module according to claim 9, wherein, in said second process the plastic region is formed by an electrolytic plating method or electroless plating method using gold.

13. A method for manufacturing a semiconductor module according to claim 9, wherein in said second process a shape of the bump is formed in a manner such that the closer to a tip part thereof, the smaller a diameter thereof becomes, and
   wherein in said third process the tip part of said bump is plastic deformed so that it has a reversed mesa structure.

* * * * *